(12) United States Patent
Lee et al.

(10) Patent No.: US 9,003,054 B2
(45) Date of Patent: Apr. 7, 2015

(54) COMPRESSING NULL COLUMNS IN ROWS OF THE TABULAR DATA STREAM PROTOCOL

(75) Inventors: Il-Sung Lee, Seattle, WA (US); Matthew A. Neerincx, Bellevue, WA (US); Peter Gvozdjak, Sammamish, WA (US); Chadwin James Mumford, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1416 days.

(21) Appl. No.: 11/923,841

(22) Filed: Oct. 25, 2007

(65) Prior Publication Data

US 2009/0112889 A1    Apr. 30, 2009

(51) Int. Cl.
*G06F 15/16* (2006.01)
*H04L 12/879* (2013.01)
*H04L 12/861* (2013.01)
*H04L 12/883* (2013.01)

(52) U.S. Cl.
CPC .............. *H04L 49/901* (2013.01); *H04L 49/90* (2013.01); *H04L 49/9021* (2013.01)

(58) Field of Classification Search
USPC ............ 709/232, 200, 246–247, 201–203, 709/217–222; 707/10, 692–693, 722, 745, 707/899, 602–604, 634–639, 713–720, 732, 707/754–757
See application file for complete search history.

(56) References Cited

U.S. PATENT DOCUMENTS

| | | | |
|---|---|---|---|
| 5,590,324 A | | 12/1996 | Leung et al. |
| 5,974,416 A | | 10/1999 | Anand et al. |
| 6,112,207 A | * | 8/2000 | Nori et al. ..................... 707/101 |
| 6,112,210 A | | 8/2000 | Nori et al. |
| 6,151,602 A | * | 11/2000 | Hejlsberg et al. ............... 707/10 |
| 6,266,666 B1 | | 7/2001 | Ireland et al. |
| 6,356,946 B1 | * | 3/2002 | Clegg et al. ................... 709/231 |
| 6,438,146 B1 | * | 8/2002 | Brafford ......................... 370/537 |
| 6,438,559 B1 | | 8/2002 | White et al. |
| 6,493,761 B1 | * | 12/2002 | Baker et al. ................... 709/230 |
| 6,591,272 B1 | | 7/2003 | Williams |

(Continued)

FOREIGN PATENT DOCUMENTS

JP      02-012463      1/1990
JP    1995-271696    10/1995

(Continued)

OTHER PUBLICATIONS

Michelle Dumier. Microsoft SQL Server 2008. Product Overview. Published Jul. 2007. http://download.microsoft.com/download/a/c/d/acd8e043-d69b-4f09-bc9e-4168b65aaa71/SQL2008_ProductOverview.doc.

(Continued)

*Primary Examiner* — Greg C Bengzon
(74) *Attorney, Agent, or Firm* — Nicholas Chen; Kate Drakos; Micky Minhas

(57) ABSTRACT

Systems and methodologies that enhance a Tabular Data Stream (TDS) protocol by enabling efficient transmission of a row(s) with null columns(s). An identification component employs a bit map that can be positioned at beginning of a row, to indicate to the receiving side (e.g., a client) columns that are to be sent. Accordingly, by distinguishing columns that are null from columns that are not null—followed by sending columns that are not null—transmission resources can be effectively employed.

20 Claims, 10 Drawing Sheets

(56) References Cited

U.S. PATENT DOCUMENTS

| | | | |
|---|---|---|---|
| 6,907,395 | B1 | 6/2005 | Hunt et al. |
| 6,976,034 | B1 | 12/2005 | Melick |
| 7,013,312 | B2 | 3/2006 | Bala |
| 7,171,427 | B2 | 1/2007 | Witkowski et al. |
| 7,188,111 | B2 | 3/2007 | Chen |
| 7,577,667 | B2 * | 8/2009 | Hinshaw et al. ............... 1/1 |
| 8,165,124 | B2 * | 4/2012 | Tsirtsis et al. ............ 370/392 |
| 8,433,822 | B2 * | 4/2013 | Bibr et al. ............... 709/246 |
| 2003/0018644 | A1 | 1/2003 | Bala et al. |
| 2003/0076832 | A1 * | 4/2003 | Ni ........................ 370/395.1 |
| 2004/0181537 | A1 * | 9/2004 | Chawla et al. ............ 707/100 |
| 2005/0182800 | A1 * | 8/2005 | Ashwin et al. ............ 707/203 |
| 2005/0281470 | A1 | 12/2005 | Adams |
| 2006/0053164 | A1 | 3/2006 | Ewing |
| 2006/0233129 | A1 * | 10/2006 | Karmakar et al. ......... 370/328 |
| 2006/0274737 | A1 * | 12/2006 | Liu et al. ................. 370/389 |
| 2007/0050381 | A1 * | 3/2007 | Hu et al. ................. 707/100 |
| 2007/0078839 | A1 * | 4/2007 | Teodoro et al. ............. 707/4 |
| 2007/0106998 | A1 * | 5/2007 | Zeldin et al. ............. 719/313 |
| 2008/0071818 | A1 * | 3/2008 | Apanowicz et al. ........ 707/101 |
| 2008/0172366 | A1 | 7/2008 | Hannel et al. |
| 2008/0294676 | A1 * | 11/2008 | Faerber et al. ............ 707/102 |
| 2009/0019103 | A1 * | 1/2009 | Tommaney et al. ........ 709/201 |
| 2009/0022094 | A1 * | 1/2009 | Karmakar et al. ......... 370/328 |
| 2009/0028142 | A1 * | 1/2009 | Schmidt et al. ........... 370/389 |
| 2011/0138076 | A1 * | 6/2011 | Spicer et al. ............. 709/246 |

FOREIGN PATENT DOCUMENTS

| | | |
|---|---|---|
| JP | 1998-55323 | 2/1998 |
| JP | 2001-333039 | 11/2001 |
| JP | 2004-165164 | 9/2004 |
| WO | 2009/055796 | 7/2009 |

OTHER PUBLICATIONS

Tabular Data Stream Protocol. Microsoft SQL Server 2000. http://msdn2.microsoft.com/en-us/library/aa174503(sql.80).aspx. Last accessed Oct. 18, 2007.

Daniel J. Abadi, et al. Integrating Compression and Execution in Column-Oriented Database Systems. http://db.lcs.mit.edu/projects/cstore/abadisigmod06.pdf. Last accessed Oct. 18, 2007.

International Search Report mailed Apr. 20, 2009 in PCT/US2008/080827 (4 pgs).

Chinese Notice on the First Office Action mailed Oct. 26, 2011, in Application No. 200880113486 (9 pages).

European International Search Report filed Jun. 11, 2009, in Application No. 08840789 (4 pages).

Japanese Application 2010-531212, Notice of Rejection mailed May 11, 2012, 5 pages.

Unoki, Masayuki "Strategy of SYBASE for a year of 2000," Business Communication, vol. 33, No. 7, pp. 19 to 24, Business Communication, Japan, Jul. 1, 1996.

U.S. Appl. No. 11/767,556, Non-Final Office Action mailed Jun. 4, 2009, 10 pages.

U.S. Appl. No. 11/767,556, Amendment and Response filed Dec. 4, 2009, 10 pages.

U.S. Appl. No. 11/767,556, Final Office Action mailed Mar, 19, 2010, 11 pages.

U.S. Appl. No. 11/767,556, Amendment and Response filed May, 19, 2010, 7 pages.

U.S. Appl. No. 11/767,556, Non-Final Office Action mailed Jun. 16, 2010, 13 pages.

U.S. Appl. No. 11/767,556, Amendment and Response filed Sep. 16, 2010, 10 pages.

U.S. Appl. No. 11/767,556, Final Office Action mailed Nov. 26, 2010, 15 pages.

U.S. Appl. No. 11/767,556, Amendment and Response filed Jan. 26, 2011, 13 pages.

U.S. Appl. No. 11/767,556, Non-Final Office Action mailed Feb. 11, 2013, 13 pages.

Chinese Application 200880018402.7, Notice on Grant of Patent Right for Invention dated May 23, 2012, 4 pages.

European Application 08769899.9, Search Report mailed Mar. 5, 2009, 4 pages.

PCT Application PCT/US2008/065318, Search Report mailed Dec. 31, 2008, 4 pages.

Mu, Xiangming. Java Table Browser: Transportation and Presentation of Large Statistical Tables Over Networks. May 2000. http://ils.unc.edu/MSpapers/2625.pdf. Last accessed May 23, 2007, 62 pages.

Baxter, Rob, et al. BinX—A Tool for Retrieving, Searching and Transforming Structured Binary Files http://www.necs.ac.uk/events/ahm2003/AHMCD/pdf/149.pdf. *Las accessed* May 23, 2007, 8 pages.

Open ServerConnect Programmer's Reference for PL/1. Apr. 8, 1998. http://download.sybase.com/pdfdocs/mispsg1200e/oscprfpl.pdf. Las accessed May 23, 2007, 442 pages.

Chinese Application 200880113486.2, Notice on the Second Office Action mailed Sep. 4, 2012, 6 pages.

Chinese Application 200880113486.2, Notice on the Third Office Action mailed Oct. 11, 2012, 9 pages.

Chinese Application 200880113486.2, Decision on Rejection mailed Jan. 5, 2013, 7 pages.

Japanese Application 2010-531212, Notice of Allowance mailed Feb. 1, 2013, 6 pages.

* cited by examiner

COMPRESSING NULL COLUMNS IN ROWS OF THE TABULAR DATA STREAM PROTOCOL

BACKGROUND

Advances in computer technology (e.g., microprocessor speed, memory capacity, data transfer bandwidth, software functionality, and the like) have generally contributed to increased computer application in various industries, such that organization of computer systems has changed dramatically. The concept of a large computer center with a single large computer to which all users bring their work is obsolete. Similarly, Data Base Management Systems (DBMS systems) have long since moved from a centralized mainframe environment to a de-centralized or distributed environment. For example, one or more PC "client" systems can be connected via a network to one or more server-based database systems (Structure Query Language—SQL database server). Known examples of computer networks include local-area networks (LANs) where the computers are geographically close together (e.g., in the same building), and wide-area networks (WANs) where the computers are farther apart and are connected by telephone lines or radio waves.

Often, networks are configured as "client/server" networks, such that computers on the network classify as a "client" or a "server." Servers are powerful computers or processes dedicated to managing shared resources, such as storage (e.g. disk drives), printers, modems, or the like. Servers are often dedicated, meaning that they perform virtually no other tasks besides their server tasks. For instance, a database server manages database information such as processing database queries from various clients. The client portion of client-server architecture typically includes PCs or workstations, which rely on server(s) to perform operations. Typically, a client runs a "client application" that relies on a server to perform some operations, such as returning particular database information. Over such networks, various request-response protocols transport information according to predetermined set of rules.

One such request-response protocol is the Tabular Data Stream (TDS) protocol, which is a message oriented application level protocol employed for transfer of requests and responses between client and server systems. TDS can include native support for traditional SQL data types, such as character (char), variable-length character (vchar), binary (blob), date-time, time stamp, vendor-specific data types, and the like. In systems employing TDS, it is typical for a client (e.g., user or application program) to establish a long-lived connection with a server (e.g., database.) Upon a successful hand shake and establishment of the connection via a suitable supported transport/session level protocol, a complete message transfers from client to server after which a complete response travels from server to client.

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

The subject innovation enhances a Tabular Data Stream (TDS) protocol by enabling efficient transmission of a row(s), via an identification component that designates null columns, to reduce number of bits during transmission of query results from a sever to a client. Such identification component employs a bit map that can be positioned at beginning of a row, to indicate to the receiving side (e.g., a client) columns that are to be sent. Accordingly, by distinguishing columns that are null from columns that are not null followed by sending columns that are not null, transmission resources can be effectively employed.

In a related aspect, the identification component can employ a header portion that includes a bit for each column, to indicate whether the column is null or not. Such header portion can be sent initially from the server, and indicate the number of columns that are to be transmitted followed by rows of data. As such, by initially examining a row that is to be sent ahead of time, an associated bit map is calculated. The bit map identifies null columns, wherein by not transmitting such null columns, space can be saved and efficiency improved.

According to a further methodology, a request can be initially sent to a server. Subsequently, the server processes the request (e.g. joins between tables, associated operations and the like) to materialize the result set and designate the layout of the data, such as the columns of the data. Typically, a result being sent from a server to the client can include any number of columns and rows existing therein. Such result set can be the result of joining between different items, and be stored in a table. Next, rows associated with table can be initially examined, to compute a bit map on a row-by-row basis associated with the table. Subsequently, metadata for the result set (which designates what columns are to come)—is initially sent to the client followed by sending rows of data related to the result sets.

Moreover, information can initially be transmitted to the network layer, as a response indicating the actual columns and metadata about the columns. Accordingly, before transmission of results sets, the client is notified regarding: the number of columns that are to be transferred (e.g., the number of columns in a row.) Hence, by initially sending such metadata, the client becomes aware regarding the number of columns that is to be received. In a related aspect, a null compression of the subject innovation is employed if the nullable columns exceed a predetermined threshold value.

To the accomplishment of the foregoing and related ends, the innovation, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

DETAILED DESCRIPTION

The various aspects of the subject innovation are now described with reference to the annexed drawings, wherein like numerals refer to like or corresponding elements throughout. It should be understood, however, that the drawings and detailed description relating thereto are not intended to limit the claimed subject matter to the particular form disclosed. Rather, the intention is to cover all modifications, equivalents and alternatives falling within the spirit and scope of the claimed subject matter.

Figure 1:
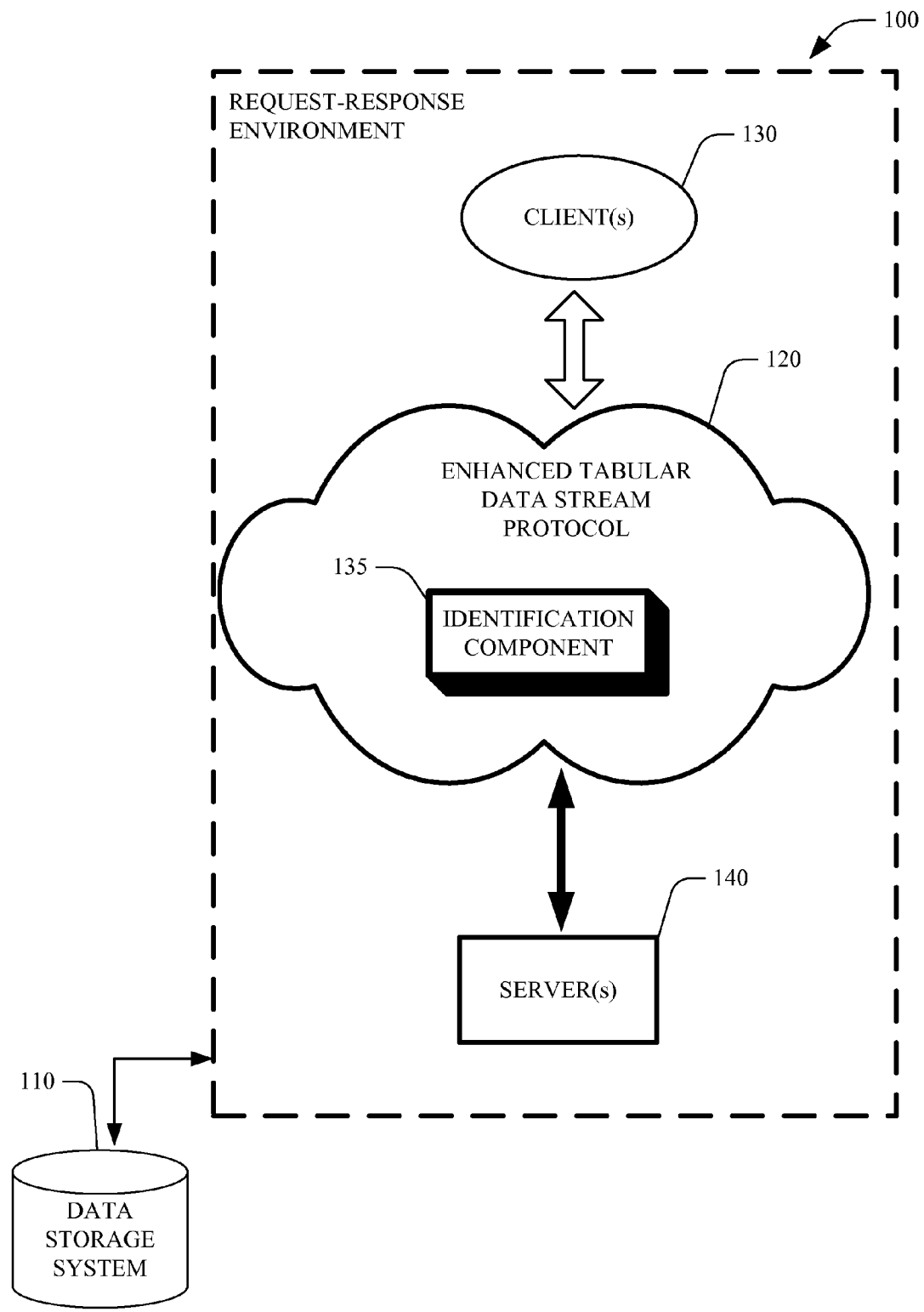
FIG. 1 illustrates an exemplary Tabular Data Stream (TDS) protocol that enables efficient transmission of result sets in response to a query according to an aspect of the subject innovation.

FIG. 1 illustrates a block diagram for a system 100 that employs an enhanced Tabular Data Stream (TDS) protocol 120 in accordance with an aspect of the subject innovation. Before transmission of the query results by the server 140, the client 130 is notified regarding: the number of columns that are to be transferred; e.g., the number of columns in a row. Accordingly, by initially sending such metadata, the client 130 becomes aware regarding the number of columns to be received. Moreover, by distinguishing columns that are null from columns that are not null followed by sending columns that are not null, transmission resources can be effectively employed. The enhanced TDS protocol 120 enables such efficient transmission of a row(s) with null columns(s), via an identification component 135. The identification component 135 designates null columns, to reduce number of bits during transmission of query results from the sever 140 to the client 130. It is to be appreciated that even though the subject specification describes NULL compression primarily in context of communication from the server to the client, a reverse communication, such as from the client to the server is also within the realm of the subject innovation.

The system 100 is associated with a data storage system 110, which can be a complex model based database structure, wherein an item, a sub-item, a property, and a relationship are defined to allow representation of information within a data storage system as instances of complex types. For example, the data storage system 110 can employ a set of basic building blocks for creating and managing rich, persisted objects and links between objects. An item can be defined as the smallest unit of consistency within the data storage system 110, which can be independently secured, serialized, synchronized, copied, backup/restored, and the like. Such item can include an instance of a type, wherein all items in the data storage system 110 can be stored in a single global extent of items. Furthermore, the data storage system 110 can be based upon at least one item and/or a container structure, and can act as a storage platform exposing rich metadata that is buried in files as items. The data storage system 110 can include the database (not shown), to support the above discussed functionality, wherein any suitable characteristics and/or attributes can be implemented. Furthermore, the data storage system 110 can employ a container hierarchical structure, wherein a container is an item that can contain at least one other item. Such containment concept can be implemented via a container ID property inside the associated class, wherein the store can also be a container in form of a physical organizational and manageability unit. In addition, the store represents a root container for a tree of containers within the hierarchical structure. As illustrated in FIG. 1, the enhanced TDS 120 employs the identification component 135 to distinguish columns that are null from columns that are not null followed by sending columns that are not null. Accordingly, transmission resources can be effectively employed.

Figure 2:
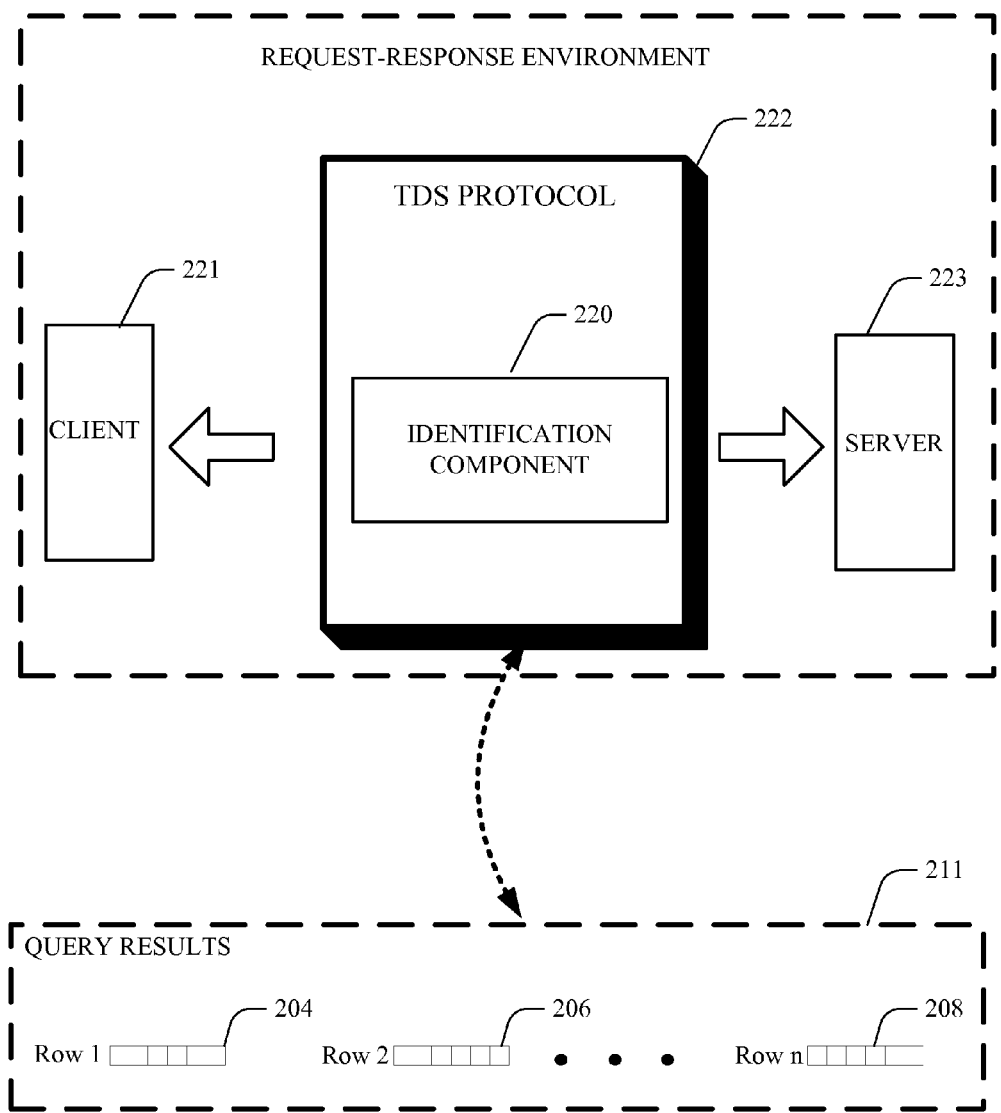
FIG. 2 illustrates an identification component as part of the TDS protocol of the subject innovation.

FIG. 2 illustrates a particular identification component 220 as part of the TDS protocol 222, in accordance with an aspect of the subject innovation. The identification component 220 employs a bit map that can be positioned at beginning of a row 204, 206, 208 (1 thru n, where n is an integer), to indicate to the receiving side (e.g., a client 221) columns that are to be sent. The identification component 220 can employ a Null Bit Compression token (NBCRow), wherein such Null bitmap compression is implemented by using a single bit to specify if each column is null or not null and also by removing all null column values from the row(s) 204, 206, 208. As such, removing the null column values—which can be up to 8 bytes per null instance—from the row(s) 204, 206, 208 provides the compression in accordance with an aspect of the subject innovation. Such null bitmap contains one bit for each column defined in column metadata (e.g., TDS token of COLMETADATA) as described in detail infra that is metadata associated with a column. For example, in the null bitmap, a bit value of 1 indicates that the column is null and therefore not present in the row. Likewise, typically a bit value of 0 can indicate that such column is not null, and hence is present in the row(s) 204, 206, 208. Moreover, such null bitmap can typically be rounded up to the nearest multiple of 8 bits, wherein there can exist 1 to 7 leftover reserved bits at the end of the null bitmap in the last byte of the null bitmap. For example, the TDS protocol 222 can implement:

Token Stream Comments
The token value is 0xD2/210
Token Stream Specific Rules

```
TokenType          := BYTE;
NullBitmapBitCount := Number of columns in resultset;
NullBitmapByteCount := (NullBitmapBitCount+7)/8;
NullBitmap         := NullBitmapByteCount * BYTE;
ColumnData         := Bytes of data for a single non-null column
value;
AllColumnData      := {ColumnData};
NBCROW             := TokenType, NullBitmap, AllColumnData
```

Null compressed and normal rows can be intermixed in the same result set. The ColumnData can be repeated once for each non-null column of data, and the server 223 can decide not to send a NBCROW token, if there will be no byte savings, for example if the result set has no nullable columns, or if a particular row in a result set has no null values. In addition, the NBCROW and ROW tokens can be intermixed in the same result set.

For example, when determining whether a specific column is null, consider all the columns from left to right ordered using a zero-based index from 0 to 65534 as they occur in the ColumnData section of the COLMETADATA token. As such, the null bitmap indicates that a column is null using a zero bit at the following byte and bit layout:

| Byte 1 | Byte 2 | Byte 3 |
|---|---|---|
| 07 06 05 04 03 02 01 00 | 15 14 13 12 11 10 09 08 | 23 22 21 20 19 18 17 16 |

Hence the first byte will contain flags for columns 0 through 7, with the least significant (or rightmost) bit within the byte indicating the zeroth column and the most significant (or leftmost) bit within the byte indicating the seventh column. Column index 8 would be in the second byte as the least significant bit, and the like. In general, if the null bitmap bit is set, the column is null and no null token value for the column can follow in the row. If the null bitmap bit is clear, the column is not null and the value for the column follows in the row.

Figure 3:
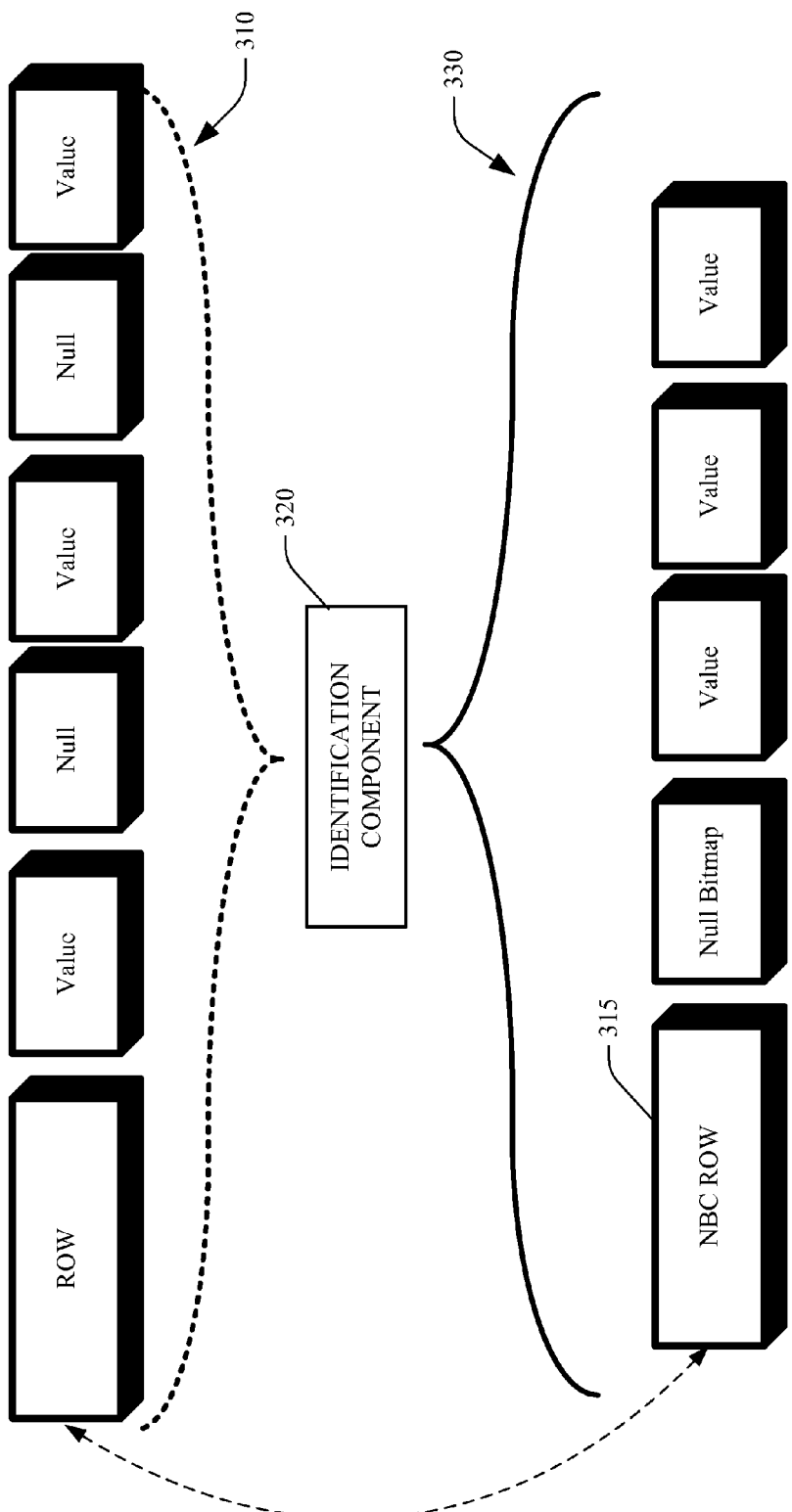
FIG. 3 illustrates a particular example of bit compression in accordance with an aspect of the subject specification.

FIG. 3 illustrates a particular aspect of the identification component 320 in accordance with an aspect of the subject innovation. The identification component 320 can reduce the space that nulls take in the arrangement 310 to create the more compressed arrangement 330 (e.g., from 1 to 8 bytes per null instance depending upon the data type). The arrangement 310 can use up to 8 bytes per null column instance in a row. For example, a result set with 1000 null varchar (max) columns can use 8000 bytes per row to represent such nulls. The identification component 320 can improve overall performance and network bandwidth with result sets that have a substantially large numbers of nulls, which are compressed in the TDS row arrangement 330.

Moreover, in the TDS row format 330 of the subject innovation, the null bit map compression null values are not typically sent inside the row. Rather, a token 315 that identifies the subsequent bits to NBCRow can be employed at the beginning of the row to indicate which columns are null; and/or which columns are not null (using 1 bit per column), for example. Moreover, non-null column values can be sent in the same fashion as with a ROW token.

Figure 4:
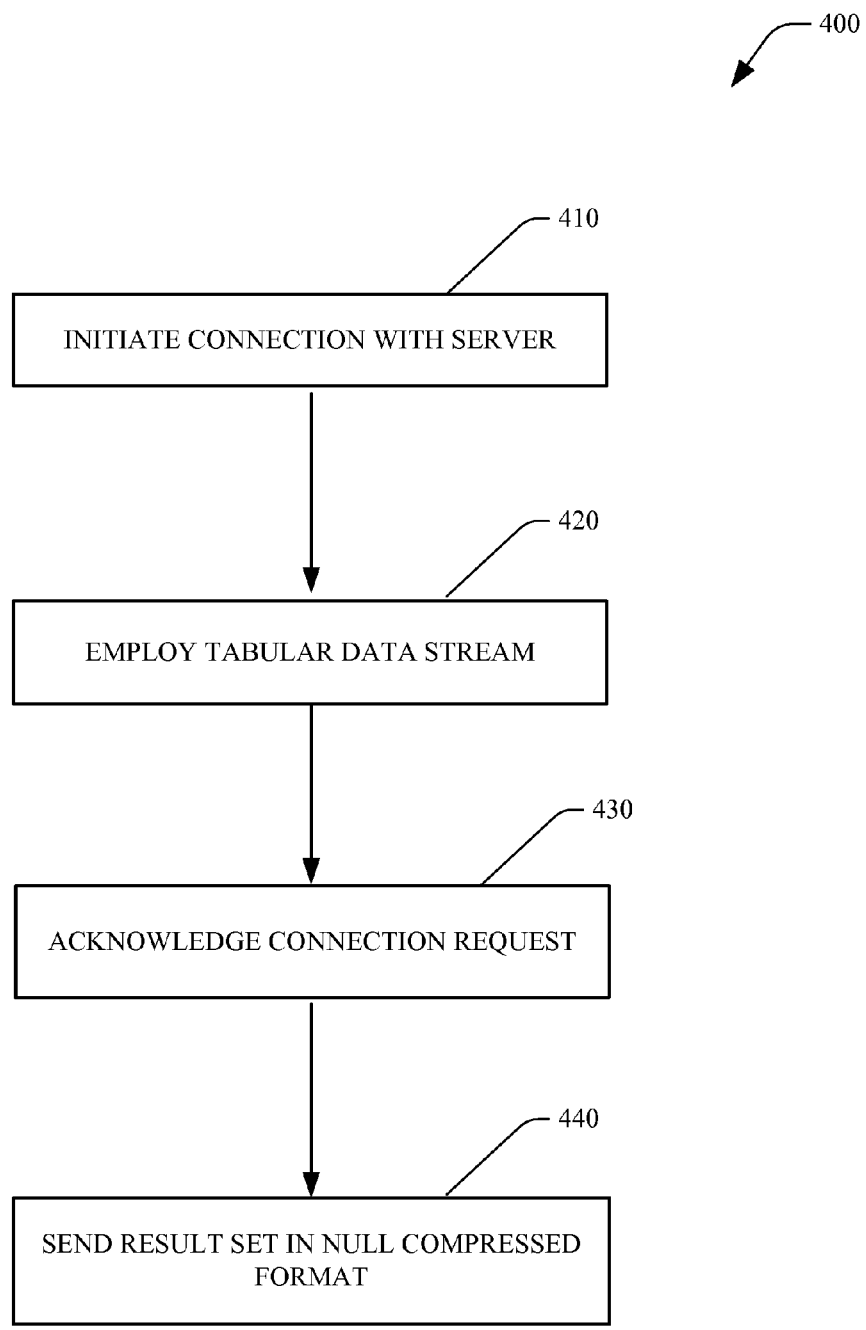
FIG. 4 illustrates a methodology of sending query results in a compressed manner in accordance with an aspect of the subject innovation.

FIG. 4 illustrates a related methodology 400 of data compression for efficient transmission in accordance with an aspect of the subject innovation. While the exemplary method is illustrated and described herein as a series of blocks representative of various events and/or acts, the subject innovation is not limited by the illustrated ordering of such blocks. For instance, some acts or events may occur in different orders and/or concurrently with other acts or events, apart from the ordering illustrated herein, in accordance with the innovation. In addition, not all illustrated blocks, events or acts, may be required to implement a methodology in accordance with the subject innovation. Moreover, it will be appreciated that the exemplary method and other methods according to the innovation may be implemented in association with the method illustrated and described herein, as well as in association with other systems and apparatus not illustrated or described. At 410, a client initiates a connection with the server, via sending a logon data stream on the network, for example (e.g., initiating a hand shake). Such communication from the client to the server can contain multiple commands, and a response from the server can return a plurality of result sets. In such communication initiated, session, presentation, and application service elements are provided by TDS at 420. Next and at 430, the server can acknowledge connection request by the client.

Subsequently and at 440, result set associated with the query can be sent in null compressed format. Such Null bitmap compression can be implemented by using a single bit to specify if each column is null or not null and by removing all null column values from the row(s). As such, removing the null column values—which can be up to 8 bytes per null instance—from the row(s) provides the compression in accordance with an aspect of the subject innovation.

Figure 5:
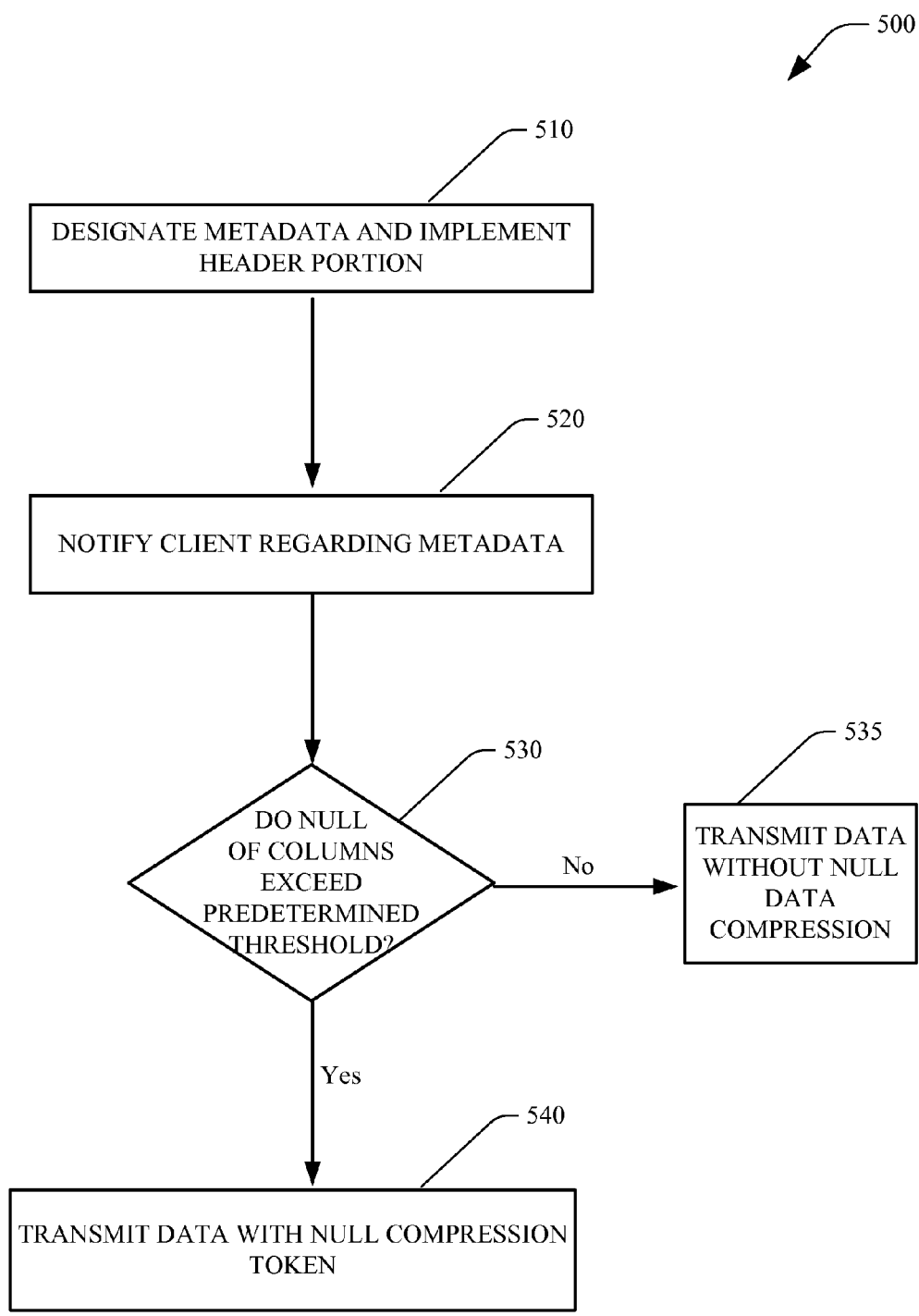
FIG. 5 illustrates a related methodology of transmitting data with null compression tokens.

FIG. 5 illustrates a particular methodology 500 of enhancing a TDS to efficiently transmit rows with null columns in accordance with an aspect of the subject innovation, initially and at 510, metadata for the result set that explains what columns are to come, which can contain null values and the like can be designated at 510. For example, the metadata can indicate which columns are nullable. Such information can then be transmitted to the network layer, as a response indicating the actual columns and metadata about the columns. Accordingly, before transmission results sets, the client is notified at 520 regarding: the number of columns that are to be transferred; e.g., the number of columns in a row. At 530, a determination is made whether the number of null columns exceeds a predetermined threshold. If not, the methodology proceeds to act 535 wherein the data can be transmitted without null compression. Otherwise, the methodology 500 proceeds to act 540, wherein by distinguishing columns that are null from columns that are not null followed by sending columns that are not null, transmission resources can be effectively employed.

Figure 6:
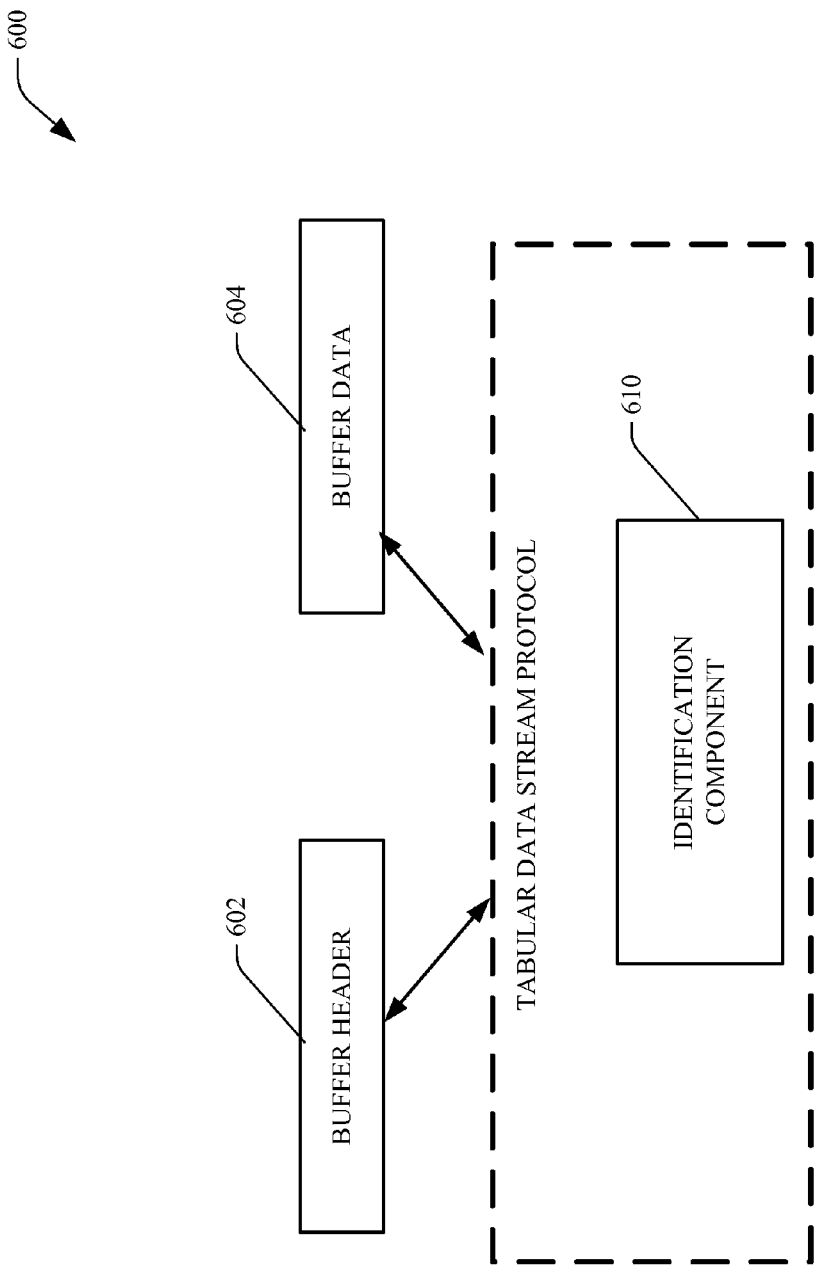
FIG. 6 illustrates an exemplary buffer header arrangement as part of an identification component that allows client servers to transmit data efficiently.

FIG. 6 illustrates an exemplary buffer header arrangement 600 as part of an identification component 610 that designates null columns, to reduce number of bits during transmission of query results from a sever to a client. A call from the client to the server can send one or more parameters to the server, wherein a predetermined header portion can define type of value parameter, columns, data types, rows, binary formats and associated buffers.

Typically, the buffer 600 is the unit written or read at one time, and can be modeled as a "packet", wherein a message can consist of one or more buffers. A buffer can include a buffer header 602, which can be followed by buffer data 604 that contains the message. Moreover, each new message can start in a new buffer.

In general, both the Client and Server attempt to read a buffer full of data, and can pick out the header to observe how much more (or less) data exists in the communication. When the underlying network interface insists on blocking until all bytes specified in the read have been read, the client can read the header and then determine how much more to read. For example, at login time, client can specify a requested "packet" size, which can identify a size employed to break large messages into smaller "packets". Moreover, messages that pass between client and the server for passing whole tables can typically include one of two types; either a "token stream" or a "tokenless stream". A token stream consists of one or more "tokens" each followed by some token specific data. A "token" represents a single byte identifier employed to describe data that follows it (e.g. contains token data type, token data length and the like.) Tokenless streams are typically used for simple messages, while messages that can require a more detailed description of the data within it are sent as a token stream The buffer header can be associated with a header portion that includes a bit for each column, to indicate whether it is null or not. Such header portion can be sent initially from the server, to indicate the number of columns that are to be transmitted followed by rows of data. As such, space can be saved by not transmitting the null bitmaps by initially examining a row that is to be sent ahead of time, wherein an associated bit map is calculated for the row.

In one particular example, conventional systems can send a row of 16 integer nullable values (alternating non-null and null) as:

D1 04 00 00 00 01 00 04 00 00 00 01 00 04 00 00 00 01 00 04 00 00 00 01 00 04 00 00 00 01 00 04 00 00 00 01 00 04 00 00 00 01 00 04 00 00 00 01 00 Wherein the 00 values can indicate the null tokens for integer values and the 04 00 00 00 01 indicate a single integer value of 1 (04 is the length indicator and 00 00 00 01 is the value).

By implementing the subject innovation and with null row compression such row can be sent as:

D2 AA AA 04 00 00 00 01 04 00 00 00 01 04 00 00 00 01 04 00 00 00 01 04 00 00 00 01 04 00 00 00 01 04 00 00 00 01 04 00 00 00 01 [0041] Wherein AA AA represents bits->10101010 10101010 in bitmap form. It is to be noted that a row with 16 null integer tokens can be sent as: D2 FF FF.

Figure 7:
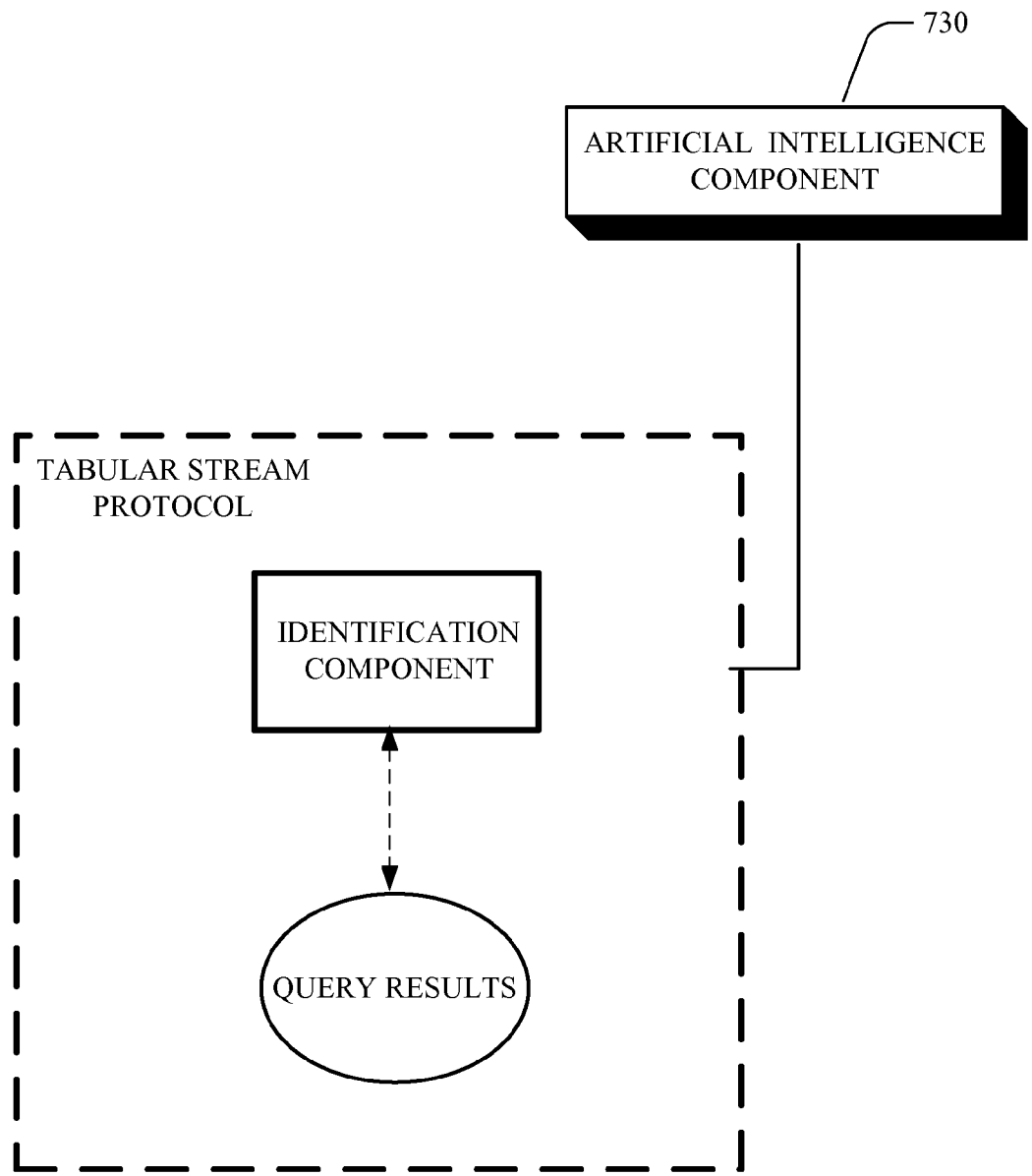
FIG. 7 illustrates an artificial intelligence (AI) component associated with the identification component, in accordance with a particular aspect of the subject innovation.

FIG. 7 illustrates an artificial intelligence (AI) component 730 that can be employed to facilitate inferring and/or determining when, where, how to calculate a bitmap for null columns on a row-by-row basis in accordance with an aspect of the subject innovation. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

The AI component 730 can employ any of a variety of suitable AI-based schemes as described supra in connection with facilitating various aspects of the herein described invention. For example, a process for learning explicitly or implicitly how null bit compression tokens are to be created for efficiently sending data can be facilitated via an automatic classification system and process. Classification can employ a probabilistic and/or statistical-based analysis (e.g., factoring into the analysis utilities and costs) to prognose or infer an action that a user desires to be automatically performed. For example, a support vector machine (SVM) classifier can be employed. Other classification approaches include Bayesian networks, decision trees, and probabilistic classification models providing different patterns of independence can be employed. Classification as used herein also is inclusive of statistical regression that is utilized to develop models of priority.

As will be readily appreciated from the subject specification, the subject innovation can employ classifiers that are explicitly trained (e.g., via a generic training data) as well as implicitly trained (e.g., via observing user behavior, receiving extrinsic information) so that the classifier is used to automatically determine according to a predetermined criteria which answer to return to a question. For example, with respect to SVM's that are well understood, SVM's are configured via a learning or training phase within a classifier constructor and feature selection module. A classifier is a function that maps an input attribute vector, $x=(x1, x2, x3, x4, xn)$, to a confidence that the input belongs to a class—that is, $f(x)=confidence(class)$.

Figure 8:
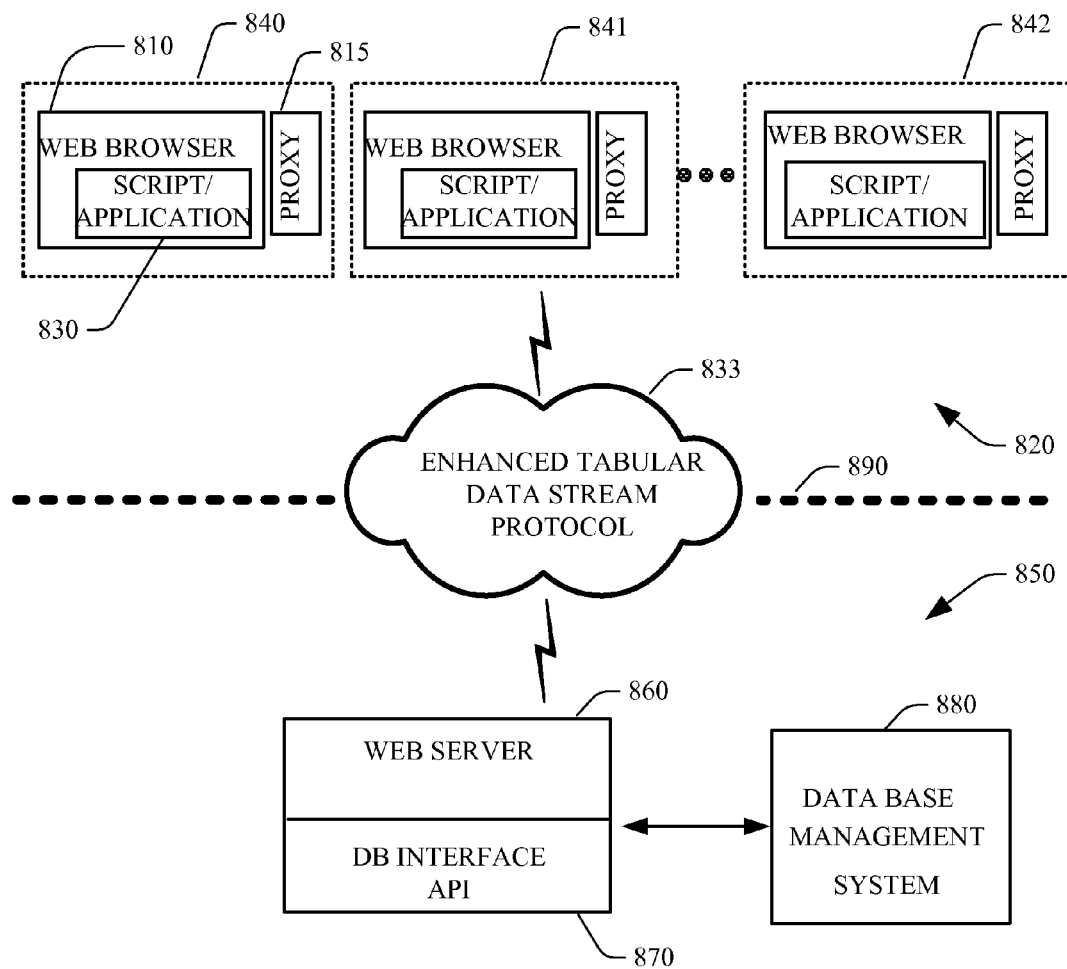
FIG. 8 illustrates an exemplary system that implements an enhanced TDS protocol according to a further aspect of the subject innovation.

FIG. 8 illustrates a system that implements an enhanced TDS protocol 833 that enables designating null columns, to reduce number of bits during transmission of query results from a sever 850 to a client 820, wherein running on the client 820 is a client process, for example, a web browser 810. Likewise, running on the server 850 is a corresponding server process, for example, a web server 860. In addition, embedded in the Web Browser 810 can be a script or application 830, and running within the run-time environment 840 of the client computer 820, can exist a proxy 815 for packaging and unpacking data packets formatted in accordance with various aspects of the subject innovation. Communicating with the server 850 is a database management system (DBMS) 880, which manages access to a database (not shown). The DBMS 880 and the database (not shown) can be located in the server itself, or can be located remotely on a remote database server (not shown). Running on the Web server 860 is a database interface Applications Programming Interface (API) 870, which provides access to the DBMS 880. The client computer 820 and the server computer 850 can communicate with each other through a network 890. When the client process, e.g., the Web browser 810, requests data from a database, the script or application 830 issues a query, which is sent across the network (e.g. internet) 890 to the server computer 850, where it is interpreted by the server process, e.g., the Web server 860. As explained earlier, the request of client to server 850 can contain multiple commands, and a response from server 850 can return a plurality of result sets. In such communication, session, presentation, and application service elements are provided by TDS. Since TDS does not typically require any specific transport provider, it can be implemented over multiple transport protocols and the network 890.

Such enhanced TDS protocol 833 can employ an identification component that designates null columns, to reduce number of bits during transmission of query results from a sever to a client. The identification component employs a bit map that can be positioned at beginning of a row, to indicate to the receiving side (e.g., a client) columns that are to be sent. Accordingly, by distinguishing columns that are null from columns that are not null followed by sending columns that are not null, transmission resources can be effectively employed.

Responses to client commands that are returned can be self-describing, and record oriented; (e.g. the data streams can describe names, types and optional descriptions of rows being returned.) On the client side 820 the data can be a login record, or a Structured Query Language (SQL) command being in a language that the server side 850 can accept, a SQL command followed by its associated binary data (e.g. the data for a bulk copy command), or an attention signal. When a connection is desired, the client 820 can send a login data stream to the server. Even though the client 820 can have more than one connection to the server 850, each connection path can be established separately and in the same manner.

Once the server 850 has received the login record from the client 820 it will notify the client that it has either accepted or rejected the connection request. Like wise to send SQL command or batch of SQL commands; then the SQL command (e.g. represented by a Unicode format) can be copied into the data section of a buffer and then sent to the SQL Server side 820. A SQL batch may span more than one buffer. In addition, various Open Data Base Connectivity (ODBC) routines can cause SQL command to be placed into a client message buffer, or can cause the message buffer to be sent to the server.

In addition, for an SQL command with binary data, the insert bulk operation can represent a case of a SQL command (e.g. in a Unicode format) followed by binary data. Initially, an insert bulk command can be sent to the server 850 in the normal way, and once an acknowledgment is received from the server 850, the client 820 can then send formatted binary data to the server 850. Such functionality can be provided by routines included in the ODBC, in accordance with one exemplary aspect of the subject innovation. Moreover, the client 820 can initially send an insert bulk SQL statement, followed by a COLMETADATA token, which describes the raw data, followed by multiple rows of binary data, to the server 850. For example, the data is not formatted in storage engine row format, but rather the format described by the COLMETADATA token. The stream is the same as if the data was being selected from the server 850 rather than being sent to the server 850.

The word "exemplary" is used herein to mean serving as an example, instance or illustration. Any aspect or design described herein as "exemplary" is not necessarily to be construed as preferred or advantageous over other aspects or designs. Similarly, examples are provided herein solely for purposes of clarity and understanding and are not meant to limit the subject innovation or portion thereof in any manner. It is to be appreciated that a myriad of additional or alternate examples could have been presented, but have been omitted for purposes of brevity.

As used in this application, the terms "component", "system", "engine" are intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

Furthermore, all or portions of the subject innovation can be implemented as a system, method, apparatus, or article of manufacture using standard programming and/or engineering techniques to produce software, firmware, hardware or any combination thereof to control a computer to implement the disclosed innovation. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Figure 9:
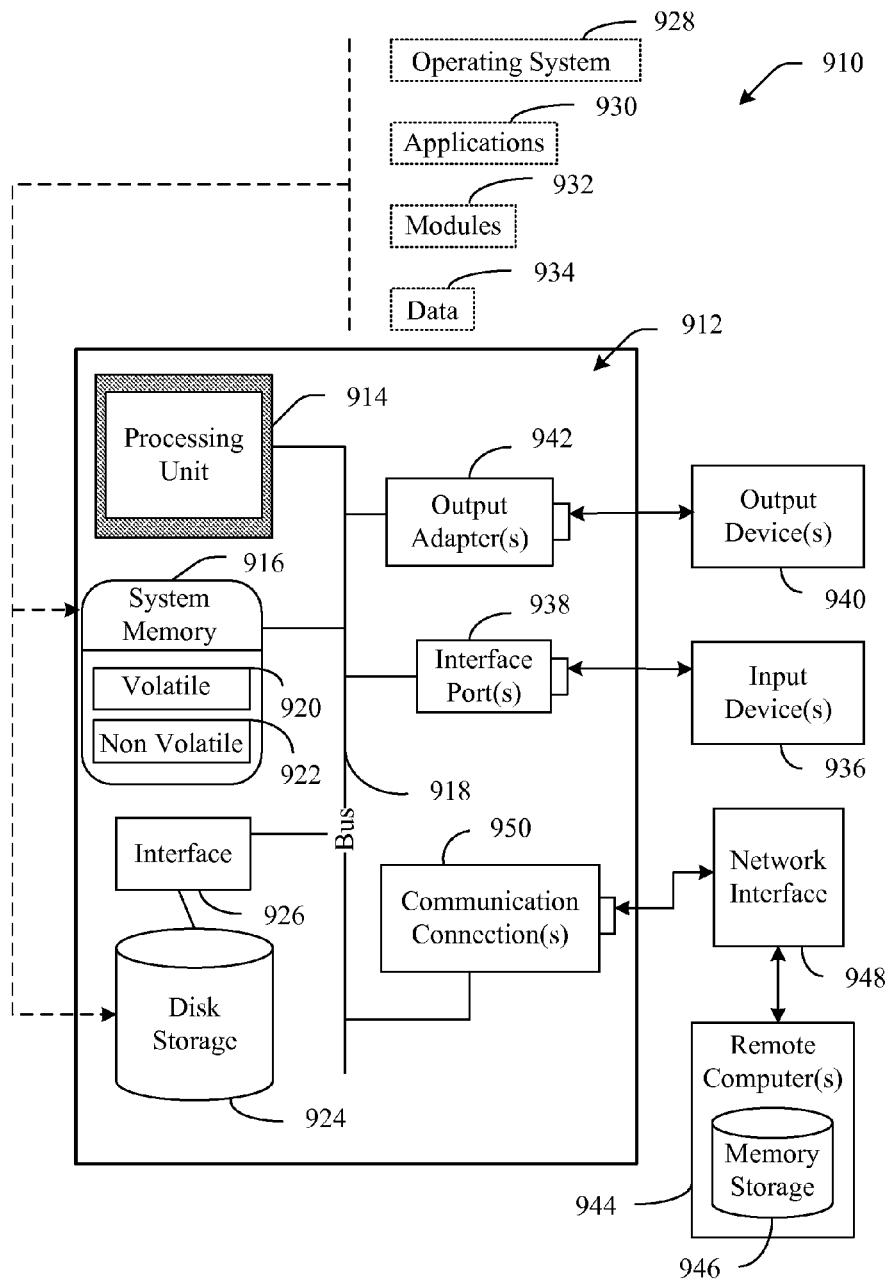
FIG. 9 illustrates an exemplary environment for implementing various aspects of the subject innovation.
Figure 10:
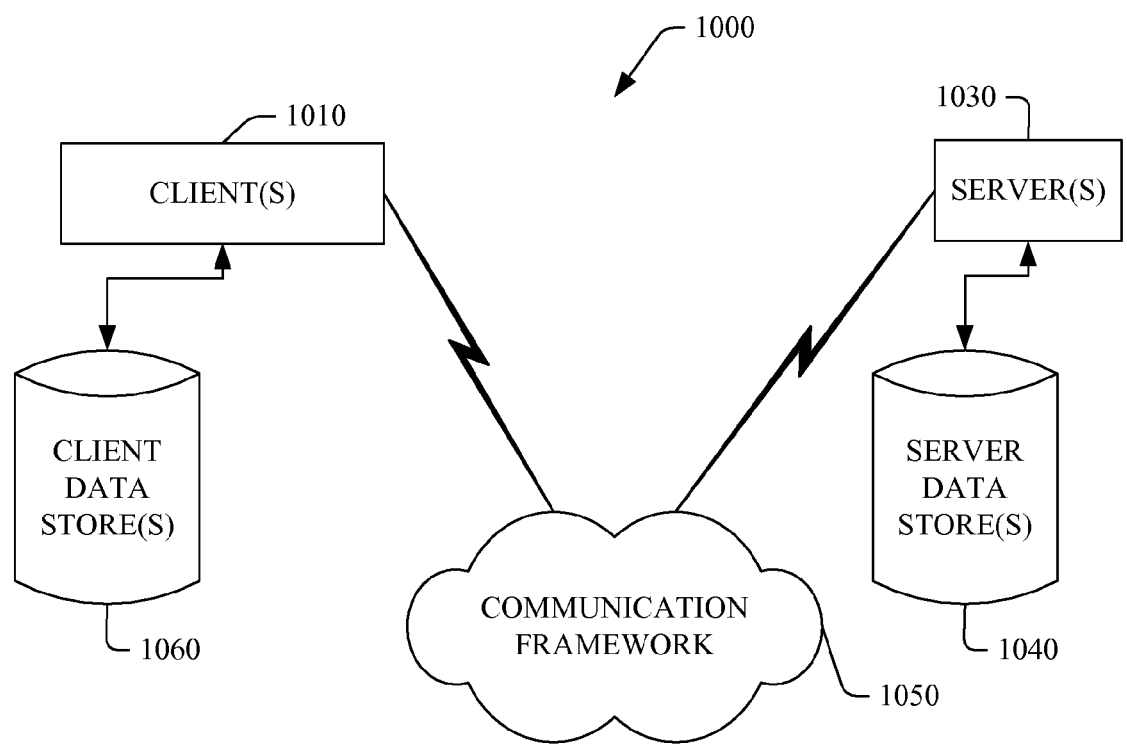
FIG. 10 is a schematic block diagram of a sample-computing environment that can be employed for transfer columns that are not null according to an aspect of the subject innovation.

In order to provide a context for the various aspects of the disclosed subject matter, FIGS. 9 and 10 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the innovation also may be implemented in combination with other program modules. Generally, program modules include routines, programs, components, data structures, and the like, which perform particular tasks and/or implement particular abstract data types. Moreover, those skilled in the art will appreciate that the innovative methods can be practiced with other computer system configurations, including single-processor or multiprocessor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects may also be practiced in distributed computing environments where tasks are performed by remote processing devices that are linked through a communications network. However, some, if not all aspects of the innovation can be practiced on stand-alone computers. In a distributed computing environment, program modules may be located in both local and remote memory storage devices.

With reference to FIG. 9, an exemplary environment 910 for implementing various aspects of the subject innovation is described that includes a computer 912. The computer 912 includes a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914.

The system bus 918 can be any of several types of bus structure(s) including the memory bus or memory controller, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 916 includes volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable ROM (EEPROM), or flash memory. Volatile memory 920 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 912 also includes removable/non-removable, volatile/non-volatile computer storage media. FIG. 9 illustrates a disk storage 924, wherein such disk storage 924 includes, but is not limited to, devices like a magnetic disk drive, floppy disk drive, tape drive, Jaz drive, Zip drive, LS-60 drive, flash memory card, or memory stick. In addition, disk storage 924 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to the system bus 918, a removable or non-removable interface is typically used such as interface 926.

It is to be appreciated that FIG. 9 describes software that acts as an intermediary between users and the basic computer resources described in suitable operating environment 910. Such software includes an operating system 928. Operating system 928, which can be stored on disk storage 924, acts to control and allocate resources of the computer system 912. System applications 930 take advantage of the management of resources by operating system 928 through program modules 932 and program data 934 stored either in system memory 916 or on disk storage 924. It is to be appreciated that various components described herein can be implemented with various operating systems or combinations of operating systems.

A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port may be used to provide input to computer 912, and to output information from computer 912 to an output device 940. Output adapter 942 is provided to illustrate that there are some output devices 940 like monitors, speakers, and printers, among other output devices 940 that require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a personal computer, a server, a router, a network PC, a workstation, a microprocessor based appliance, a peer device or other common network node and the like, and typically includes many or all of the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 950 refers to the hardware/software employed to connect the network interface 948 to the bus 918. While communication connection 950 is shown for illustrative clarity inside computer 912, it can also be external to computer 912. The hardware/software necessary for connection to the network interface 948 includes, for exemplary purposes only, internal and external technologies such as, modems including regular telephone grade modems, cable modems and DSL modems, ISDN adapters, and Ethernet cards.

FIG. 10 is a schematic block diagram of a sample-computing environment 1000 that can be employed for implementing the enhanced TDS of the subject innovation. The system 1000 includes one or more client(s) 1010. The client(s) 1010 can be hardware and/or software (e.g., threads, processes, computing devices). The system 1000 also includes one or more server(s) 1030. The server(s) 1030 can also be hardware and/or software (e.g., threads, processes, computing devices). The servers 1030 can house threads to perform transformations by employing the components described herein, for example. One possible communication between a client 1010 and a server 1030 may be in the form of a data packet adapted to be transmitted between two or more computer processes. The system 1000 includes a communication framework 1050 that can be employed to facilitate communications between the client(s) 1010 and the server(s) 1030. The client(s) 1010 are operatively connected to one or more client data store(s) 1060 that can be employed to store information local to the client(s) 1010. Similarly, the server(s) 1030 are operatively connected to one or more server data store(s) 1040 that can be employed to store information local to the servers 1030.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims.

Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computer implemented system comprising the following computer executable components:
   at least one processing unit;
   a memory, communicatively coupled to the processing unit, containing instructions that, when executed by the at least one processing unit, provide:
   a tabular data stream (TDS) protocol that transfers requests-responses between a client and a server;
   an identification component as part of the TDS, wherein the identification component determines the number of columns in a row belonging to a result set, notifies the client of the number of columns in the row before transmitting the result set, receives an indication from the client as to whether the number of columns exceeds a predetermined threshold, wherein:
   when the number of columns does not exceed the predetermined threshold, sending a result set to the client, the result set including data from both null columns and non-null columns, and
   when the number of columns exceeds the predetermined threshold, designating the null columns with an identifier to reduce bits transmitted during transmission of query results from the sever to the client and sending the result set to the client, the result set including only the data from the non-null columns.

2. The computer implemented system of claim 1, the TDS protocol further comprising a header portion that includes a bit for a column, to indicate whether the column is null.

3. The computer implemented system of claim 2, the TDS protocol further comprising a buffer modeled as a packet for transfer of the tabular formed data.

4. The computer implemented system of claim 2, the header portion indicative of number of columns that are to be sent form the server.

5. The computer implemented system of claim 4, the row with intermittent nullable columns that exceed the predetermined threshold.

6. The computer implemented system of claim 4 further comprising a database management system associated with relational databases.

7. The computer implemented system of claim 4, the client further comprising a Web Browser.

8. The computer implemented system of claim 2, the bit calculable on a result set.

9. The computer implemented system of claim 7, further comprising Open Data Base Connectivity (ODBC) routines to place SQL commands into a message buffer of the client.

10. The computer implemented system of claim 7, the SQL commands in Unicode format.

11. A computer implemented method comprising the following computer executable acts:
　transferring, by at least one processor, data from a client to a server using a tabular data stream (TDS) protocol;
　calculating, by the at least one processor, a bit map to designate null columns for a row associated with query results;
　notifying, by the at least one processor, the client of the number of columns in the row belonging to a result set, wherein the client is notified before the result set is transmitted to the client;
　receiving, by the processor, an indication from the client as to whether the number of columns associated with the query results exceeds a predetermined threshold, wherein:
　　when the number of columns does not exceed the predetermined threshold, sending the query results to the client, the result set including data from both the null columns and the non-null columns; and
　　when the number of columns exceeds the predetermined threshold, sending the query results and the bit map to the client, the query results including only the data from the non-null columns.

12. The computer implemented method of claim 11, further comprising examining data to be transferred on a row by row basis.

13. The computer implemented method of claim 12, further comprising positioning the bit map at beginning of a row.

14. The computer implemented method of claim 11, further comprising defining rows or columns or data types or a combination thereof by a header portion.

15. The computer implemented method of claim 11, further comprising employing tokens in form of single byte identifiers.

16. The computer implemented method of claim 15, further comprising describing ordering of columns.

17. The computer implemented method of claim 16, further comprising distinguishing columns that are null from other columns.

18. The computer implemented method of claim 11, further comprising inferring null columns via classifiers.

19. The computer implemented method of claim 11, further comprising saving space during transmission by not transmitting null columns.

20. A computer implemented system comprising:
　at least one processing unit;
　a memory, communicatively coupled to the processing unit, containing instructions that when executed by the at least one processing unit, provide a method for identifying null columns in exchanged data, the method comprising:
　　receiving a request for query results from a client using a tabular data stream (TDS) protocol;
　　notifying the client of the number of columns that will be transferred in the query results before the query results are transferred;
　　receiving an indication from the client as to whether the number of columns exceeds a predetermined threshold, wherein:
　　　when the number of columns does not exceed the predetermined threshold, sending the result set to the client, the result set including data from both null columns and non-null columns; and
　　　when the number of columns exceeds a predetermined threshold, designating the null columns with an identifier and sending the result set to the client, the result set including only the data from the non-null columns.

* * * * *